US009620188B2

(12) United States Patent
Manipatruni et al.

(10) Patent No.: US 9,620,188 B2
(45) Date of Patent: Apr. 11, 2017

(54) MTJ SPIN HALL MRAM BIT-CELL AND ARRAY

(71) Applicant: INTEL CORPORATION, Santa Clara, CA (US)

(72) Inventors: Sasikanth Manipatruni, Hillsboro, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/780,489

(22) PCT Filed: Jun. 21, 2013

(86) PCT No.: PCT/US2013/047153
§ 371 (c)(1),
(2) Date: Sep. 25, 2015

(87) PCT Pub. No.: WO2014/204492
PCT Pub. Date: Dec. 24, 2014

(65) Prior Publication Data
US 2016/0042778 A1    Feb. 11, 2016

(51) Int. Cl.
*G11C 11/00*    (2006.01)
*G11C 11/16*    (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC    G11C 11/161; G11C 11/1673; G11C 11/1675
(Continued)

(56) References Cited

U.S. PATENT DOCUMENTS 8,013,408 B2 *    9/2011    Maehara ............... B82Y 25/00
                                                                257/421
8,063,460 B2    11/2011    Nikonov et al.
(Continued)

FOREIGN PATENT DOCUMENTS

WO        2013025994 A2    2/2013
WO    WO2013/147781 A1    10/2013
WO    WO2014/158180 A1    10/2014

OTHER PUBLICATIONS

Notification of Transmittal of the International Search Report and the Written Opinion of the International Searching Authority, for related PCT/US2013/047153, mailed Apr. 4, 2014) 3 pages.
(Continued)

*Primary Examiner* — Pho M Luu
(74) *Attorney, Agent, or Firm* — Blakely, Sokoloff, Taylor & Zafman LLP

(57) ABSTRACT

An apparatus is described having a select line and an interconnect with Spin Hall Effect (SHE) material. The interconnect is coupled to a write bit line. A transistor is coupled to the select line and the interconnect. The transistor is controllable by a word line. The apparatus also includes an MTJ device having a free magnetic layer coupled to the interconnect.

20 Claims, 14 Drawing Sheets

(51) Int. Cl.
  *G11C 11/18* (2006.01)
  *H01L 43/08* (2006.01)
  *H01L 27/22* (2006.01)
  *H01L 43/06* (2006.01)
  *H01L 43/12* (2006.01)

(52) U.S. Cl.
  CPC ............ *G11C 11/18* (2013.01); *H01L 27/226* (2013.01); *H01L 27/228* (2013.01); *H01L 43/06* (2013.01); *H01L 43/08* (2013.01); *H01L 43/12* (2013.01)

(58) Field of Classification Search
  USPC .................................................. 365/158, 145
  See application file for complete search history.

(56) References Cited

U.S. PATENT DOCUMENTS

| | | | |
|---|---|---|---|
| 8,198,692 B2 | 6/2012 | Nikonov et al. | |
| 8,450,818 B2 | 5/2013 | Nikonov et al. | |
| 8,604,886 B2 | 12/2013 | Nikonov et al. | |
| 8,796,794 B2 | 8/2014 | Doyle et al. | |
| 8,890,120 B2 | 11/2014 | Kotlyar et al. | |
| 8,896,041 B2 * | 11/2014 | De Brosse | H01L 43/065 257/295 |
| 8,933,521 B2 | 1/2015 | Nikonov et al. | |
| 8,963,579 B2 | 2/2015 | Nikonov et al. | |
| 8,988,101 B2 | 3/2015 | Song et al. | |
| 9,028,323 B2 | 5/2015 | Tharp | |
| 9,105,832 B2 * | 8/2015 | Buhrman | G11C 11/18 |
| 9,195,787 B2 | 11/2015 | Manipatruni et al. | |
| 9,209,288 B2 | 12/2015 | Avci et al. | |
| 9,281,467 B2 * | 3/2016 | Manipatruni | H01L 43/08 |
| 9,324,402 B2 * | 4/2016 | Wu | G11C 11/161 |
| 9,355,242 B2 | 5/2016 | Manipatruni et al. | |
| 9,391,262 B1 * | 7/2016 | Nikonov | H01L 43/04 |
| 2004/0208053 A1 * | 10/2004 | Hayakawa | B82Y 25/00 365/158 |
| 2006/0062044 A1 | 3/2006 | Jeong et al. | |
| 2009/0154229 A1 | 6/2009 | Keshtbod | |
| 2009/0251949 A1 | 10/2009 | Xia | |
| 2010/0193888 A1 | 8/2010 | Gu et al. | |
| 2010/0244163 A1 * | 9/2010 | Daibou | G11C 11/16 257/421 |
| 2014/0160628 A1 | 6/2014 | Doyle et al. | |

OTHER PUBLICATIONS

Liu, Luqiao, et al., "Gate Voltage Modulation of Spin-Hall-Torque-Driven Magnetic Switching", cited as arXiv:1209.0962, http://arxiv.org/ftp/arxiv/papers/1209/1209.0962, submitted Sep. 5, 2012, 28 pages.

Office Action mailed May 6, 2016 from counterpart Taiwan Application No. 103121368, 7 pages total including translation.

Luqiao Liu, et al., "Spin-Torque Ferromagnetic Resonance Induced by the Spin Hall Effect", American Physical Society, Physical Review Letters, Jan. 2011, 6 pages.

Luqiao Liu, et al., "Spin-Torque Switching with the Giant Spin Hall Effect of Tantalum", Science vol. 336, May 2012, pp. 555-559.

Pai, Chi-Feng, et al., Spin Transfer Torque Devices Utilizing the Giant Spin Hall Effect of Tungsten, Applied Physics Letters 101, 2012, 5 pages.

* cited by examiner

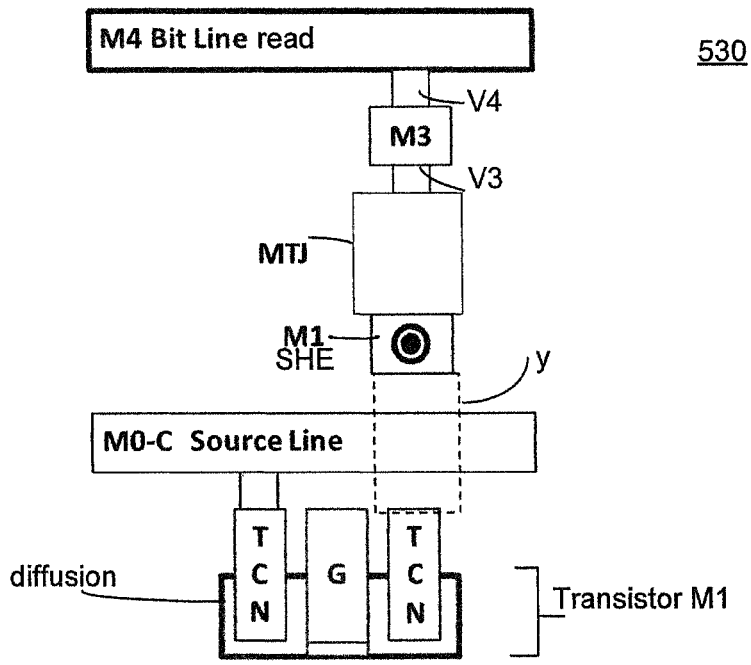
Section AA, Parallel to the length of the magnet
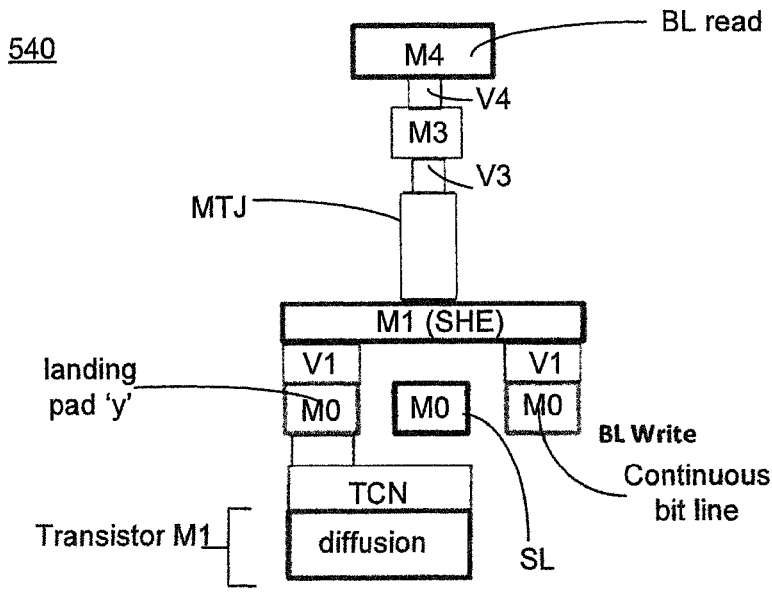
Section BB, Perpendicular to the length of the magnet

US 9,620,188 B2

MTJ SPIN HALL MRAM BIT-CELL AND ARRAY

CROSS-REFERENCE TO RELATED APPLICATION

This patent application is a U.S. National Phase Application under 35 U.S.C. §371 of International Application No. PCT/US2013/047153, filed Jun. 21, 2013, entitled "MTJ SPIN HALL MRAM BIT-CELL AND ARRAY", which is hereby incorporated by reference for all purposes.

BACKGROUND

On chip embedded memory with non-volatility can enable energy and computational efficiency. However, leading embedded memory options such as STT-MRAM (Spin-Transfer Torque Magnetic Random Access Memory) suffer from high voltage and high current-density problems during the programming (i.e., writing) of a bit-cell.

FIG. 1 illustrates a two terminal 1T-1MTJ (Magnetic Tunnel Junction) bit-cell 100 for STT-MRAM. The read and write current paths for bit-cell 100 are identical, resulting in many design trade-offs. For example, during read operation, higher resistance of MTJ device is desired than during write operation. However, same current paths for passing read and write currents discourages from having different resistances for read and write operations. To write a logical high to bit-cell 100, Bit Line is raised relative to Source (or Select) Line, and to write a logical low to bit-cell 100, Bit Line is lowered relative to the Source Line. To read from bit-cell 100, Source Line is set to logical low and MTJ resistance is sensed using weak current (e.g., $\frac{1}{8}^{th}$ of write current).

The 1T-1MTJ bit-cell 100 may have large write current (e.g., greater than 100 μA) and large voltage (e.g., greater than 0.7 V) requirements of tunnel junction based MTJ. The 1T-1MTJ bit-cell 100 may have high write error rates or low speed switching (e.g., exceeding 20 ns) in MTJ based MRAM. The 1T-1MTJ bit-cell 100 may also have reliability issues due to tunneling current in magnetic tunnel junctions. For example, insulator layer in the MTJ device is a barrier (e.g., 1KΩ to 10KΩ) which resists flow of large current, and lower current flow causes higher write errors.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5A-D are layouts of the 1T-1MTJ SHE MRAM bit-cell, according to another embodiment of the disclosure.

DETAILED DESCRIPTION

Figure 1:
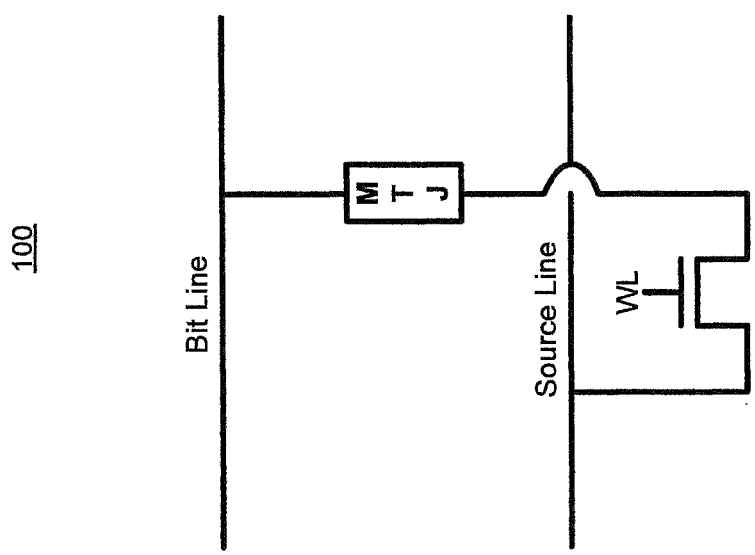
FIG. 1 illustrates a two terminal 1T-1MTJ bit-cell for STT-MRAM.

The embodiments describe a MTJ (Magnetic Tunnel Junction) SHE (Spin Hall Effect) MRAM (Magnetic Random Access Memory) bit-cell. In one embodiment, the bit-cell comprises a select line or a source line; an interconnect with SHE material, the interconnect being coupled to a write bit line; a transistor coupled to the select line and the interconnect, the transistor controllable by a word line; and an MTJ device having a free magnetic layer coupled to the interconnect, where one end of the MTJ device is coupled to a read bit line. In one embodiment, the bit-cell is a 1T (one transistor)-1MTJ SHE bit-cell. The embodiments also describe techniques for layout of the MTJ SHE MRAM bit-cell.

MTJ SHE MRAM bit-cell provides a highly compact RAM via the Giant Spin Hall Effect (GSHE), which produces high spin injection efficiency. Some non-limiting technical effects of the embodiments are that low programming voltages (or higher current for identical voltages) are enabled by the GSHE; lower write error rates are realized to enable faster MRAM (e.g., less than 10 ns); write and read paths are decoupled to enable faster read latencies; low resistance write operation is realized which allows for injection or higher currents to obtain ultra-fast switching behavior of the MTJ; read current is significantly reduced over write current and over traditional MTJs (e.g., less than 10 μA read current compared to 100 μA for nominal write operation); and improved reliability of the tunneling oxide and the MTJ is achieved, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2A:
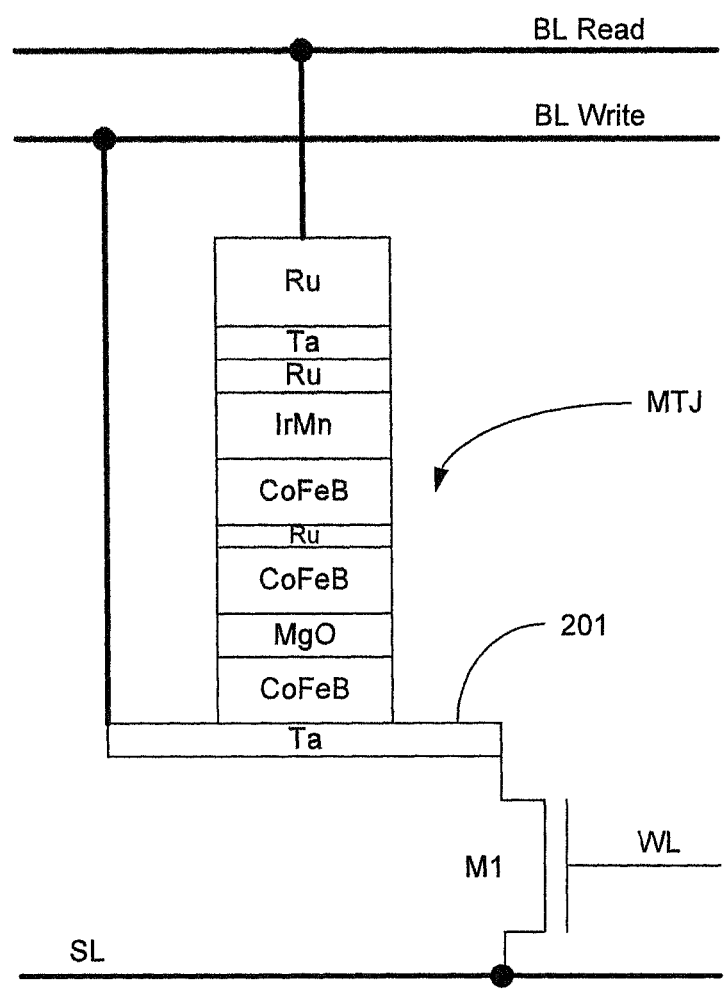
FIG. 2A is a 1T-1MTJ Spin Hall Effect (SHE) MRAM bit-cell, according to one embodiment of the disclosure.

FIG. 2A is a 1T-1MTJ SHE MRAM bit-cell 200, according to one embodiment of the disclosure. It is pointed out that those elements of FIG. 2A having the same reference numbers (or names) as the elements of any other figure can operate or function in any manner similar to that described, but are not limited to such.

In one embodiment, bit-cell 200 is a three terminal device compared to the two terminal bit-cell 100. In this embodiment, read and write bit line (BL) terminals are decoupled from one another forming the first two terminals, and the source line (SL), also referred to as the select line, forms the third terminal. In one embodiment, bit-cell 200 comprises an MTJ device with a free magnetic layer in direct contact with GSHE metal, which is a metal that exhibits SHE properties. In one embodiment, bit-cell 200 comprises transistor M1 with one of its drain/source terminals coupled to the GSHE metal 201 (also referred to as interconnect formed from SHE material), and the other of its source/drain terminals coupled to SL. In one embodiment, transistor M1 is an n-type transistor e.g., NMOS. In one embodiment, transistor M1 is a p-type transistor.

A wide combination of materials can be used for material stacking of the MTJ device. In this embodiment, the stack of materials include: $Co_xFe_yB_z$, MgO, $Co_xFe_yB_z$, Ru, $Co_xFe_yB_z$, IrMn, Ru, Ta, and Ru, where 'x,' 'y,' and 'z' are integers. In other embodiments, other materials may be used to form the MTJ device which includes a fixed magnetic layer and the free magnetic layer.

In one embodiment, GSHE metal 201 is exclusive to the MTJ device i.e., it is not shared with other MTJ devices. In one embodiment, GSHE metal 201 is directly coupled to write BL. In one embodiment, read BL is coupled to another terminal of the MTJ device. In one embodiment, word line (WL) is coupled to the gate terminal of transistor M1. In one embodiment, select transistor M1 is placed in saturation mode to overcome the existing limitation in highly scaled MRAM arrays.

In one embodiment, to write data to bit-cell 200, spin current is injected in the free magnetic layer of the MTJ device which is in direct contact with the interconnect formed from SHE material. In one embodiment, to read data from bit-cell 200, a sense amplifier senses read BL and SL.

There are several advantages of bit-cell 200 over bit-cell 100. For example, the write and read operation of the bit-cell 200 are decoupled from one another allowing for highly optimized write operation, e.g., less than 10 ns with very low BER (bit error rate). Other advantages include, for example, the read path resistance can now be optimized for read sense amplifier requirements; feasibility to achieve spin injection efficiency of approximately 100% or higher due to Spin Hall Enhancement; smaller or equal density compared to density of bit-cell 100.

Figure 2B:
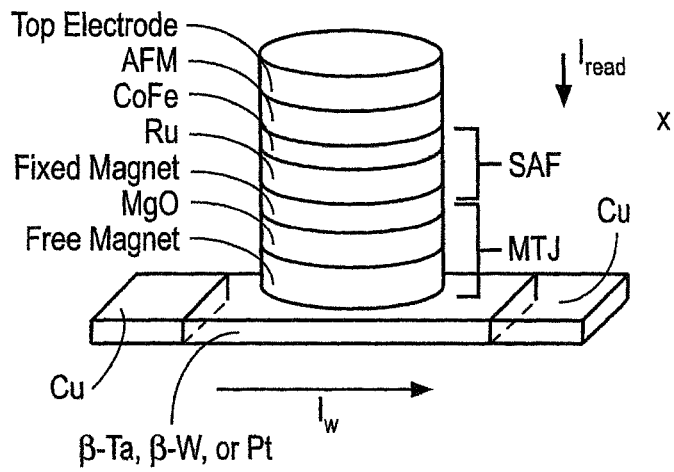
FIG. 2B illustrates a typical material stack for Giant SHE (GSHE) Spin Torque Switching based 1T-1MTJ, according to one embodiment of the disclosure.

FIG. 2B illustrates a typical material stack 220 for GSHE Spin Torque Switching based 1T-1MTJ, according to one embodiment of the disclosure. In one embodiment, MTJ stack comprises of free magnetic layer (FM1), MgO tunneling oxide, a fixed magnetic layer (FM2) with Synthetic Anti-Ferro-magnet (SAF)—CoFe/Ru based—and Anti-Ferromagnet (AFM). The SAF layer allows for cancelling the dipole fields around the free magnetic layer. A wide combination of materials can be used for material stacking.

The write electrode comprises a GSHE metal (same as 201 of FIG. 2A) made of β-Tantalum (β-Ta), β-Tungsten (β-W), Pt, Copper (Cu) doped with elements such as Iridum, bisumuth and any of the elements of 3d, 4d, 5d and 4f, 5f periodic groups in the periodic table. In one embodiment, the write electrode transitions into a normal high conductivity metal (e.g., Cu) to minimize the write electrode resistance.

Figure 2C:
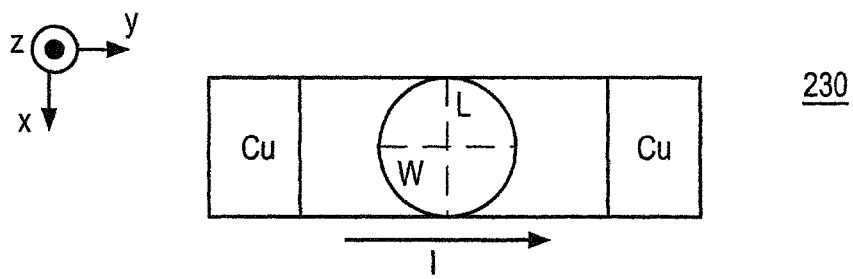
FIG. 2C is a top view of the device of FIG. 2B.

FIG. 2C is a top view 230 of the device of FIG. 2B. In FIG. 2C, the magnet is oriented along the width of the GSHE electrode for appropriate spin injection. The magnetic cell is written by applying a charge current via the GSHE electrode. The direction of the magnetic writing is decided by the direction of the applied charge current. Positive currents (along+y) produce a spin injection current with transport direction (along+z) and spins pointing to (+x) direction.

Figure 2D:
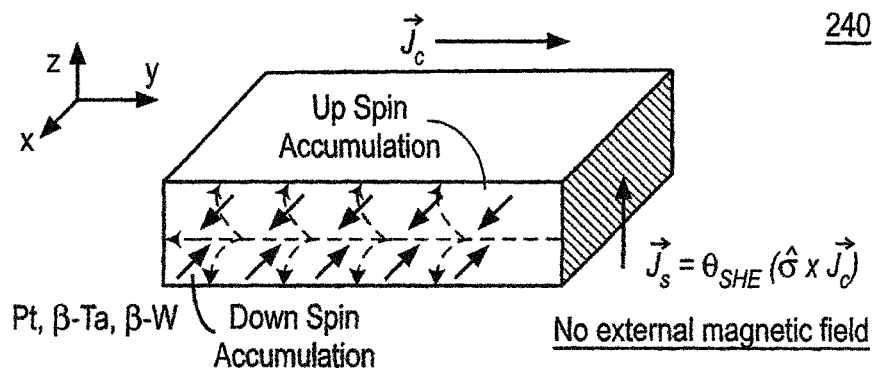
FIG. 2D shows direction of spin currents and charge currents as decided by SHE in metals.

FIG. 2D is a cross-section 240 of the GSHE material that shows direction of spin currents and charge currents as decided by SHE in metals. The injected spin current in-turn produces spin torque to align the magnet in the +x or −x direction. The transverse spin current ($\vec{I}_s = \vec{I}_\uparrow - \vec{I}_\downarrow$ with spin direction $\hat{\sigma}$) for a charge current ($\vec{I}_c$) in the write electrode is expressed as:

$$\vec{I}_s = P_{she}(w, t, \lambda_{sf}, \theta_{SHE})(\hat{\sigma} \times \vec{I}_c) \quad (1)$$

where $P_{SHE} = (\vec{I}_\uparrow - \vec{I}_\downarrow)/(\vec{I}_\uparrow + \vec{I}_\downarrow)$ is the Spin Hall injection efficiency which is the ratio of magnitude of transverse spin current to lateral charge current, 'w' is the width of the magnet, 't' is the thickness of the GSHE metal electrode, $\lambda_{sf}$ is the spin flip length in the GSHE metal, $\theta_{GSHE}$ is the spin Hall angle for the GSHE-metal to FM1 interface. The injected spin angular momentum responsible for spin torque is given by:

$$\vec{S} = \hbar \vec{I}_s/2e. \quad (2)$$

Figure 3A:
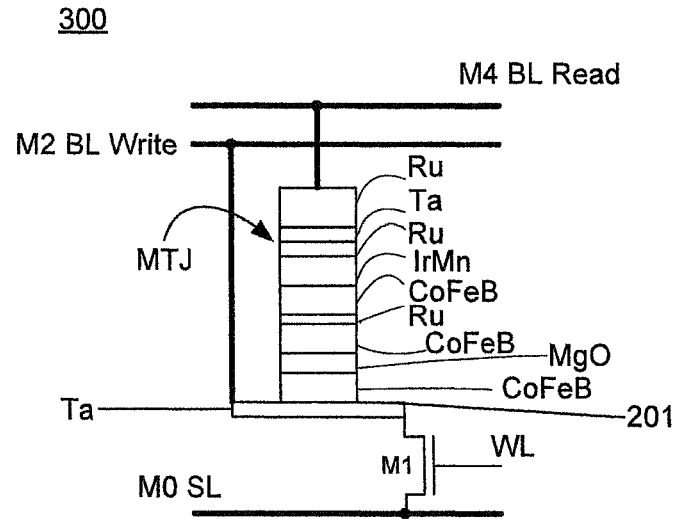
FIG. 3A-C are layouts of the 1T-1MTJ SHE MRAM bit-cell, according to one embodiment of the disclosure.
Figure 3B:
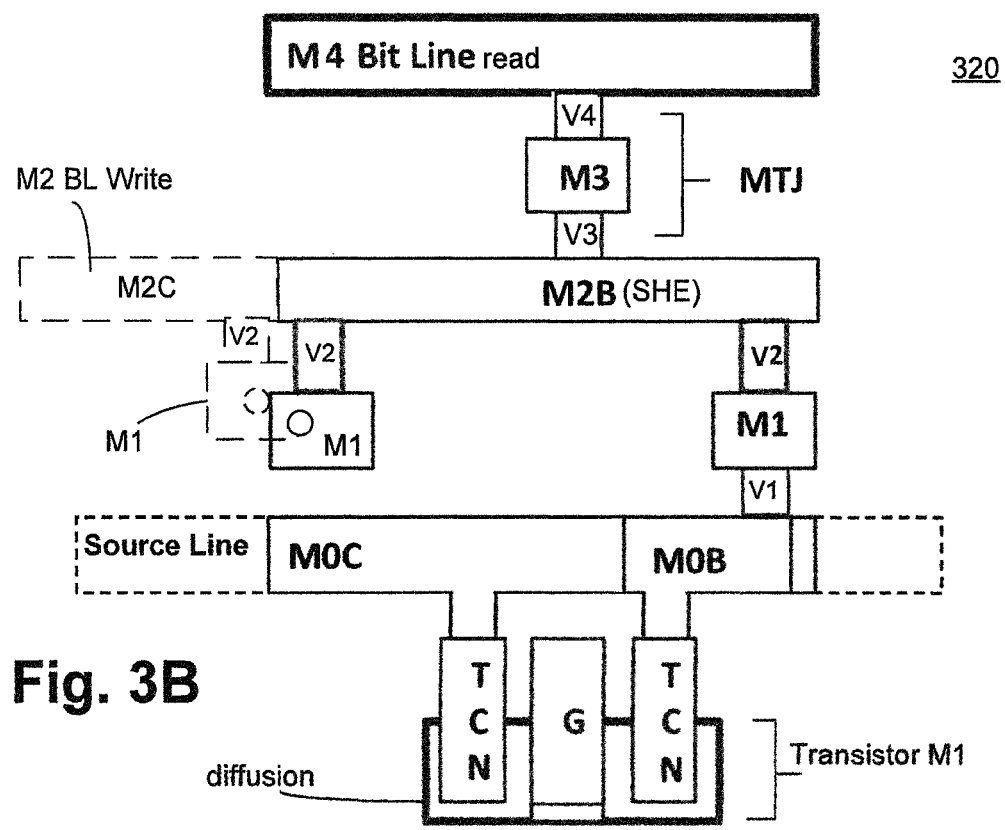
Figure 3C:
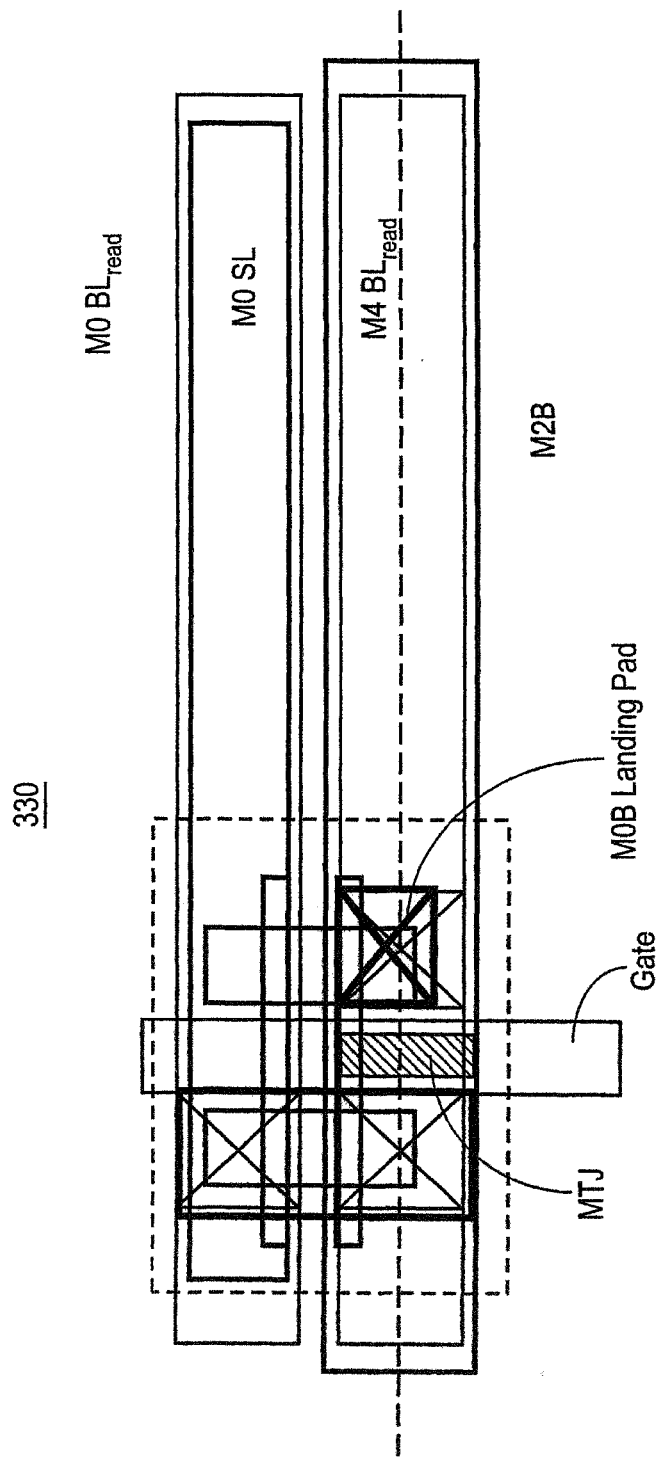

FIG. 3A-C are layouts of the 1T-1MTJ SHE MRAM bit-cell, according to one embodiment of the disclosure. It is pointed out that those elements of FIGS. 3A-C having the same reference numbers (or names) as the elements of any other figure can operate or function in any manner similar to that described, but are not limited to such.

FIG. 3A is an embodiment of 1T-1MTJ SHE MRAM bit-cell 300 in which SL is formed with metal zero (M0), write BL is formed with second metal layer (M2), read BL is formed with fourth metal layer (M4), and the MTJ device is formed in a region dedicated for third metal layer (M3). In this embodiment, M0 is the layer closest to the transistor M1 (i.e., closest to diffusion area), M2 is above M1, M3 is above M2, and M4 is above M3.

In this embodiment, bit-cell 300 comprises a select transistor M1 with gate controlled by word line WL. In one embodiment, the write terminal of bit-cell 300 is coupled to a bottom electrode patterned to make contact with the free magnetic layer of the MTJ. In one embodiment, the write current is provided by biasing M2 and M0, patterned perpendicular to the word line of bit-cell 300.

In one embodiment, select line is formed with M2, write BL is formed with M4, read BL is formed with sixth metal layer (M6), and MTJ device is positioned in the region dedicated for fifth metal layer (M5) i.e., using region of via V5, M5, and via V6. In this embodiment, M5 is above M4, and M6 is above M5. In another embodiment, select line is formed with M4, write BL is formed with M6, read BL is formed with eighth metal layer (M8), and MTJ device is positioned in the region dedicated for seventh metal layer (M7) i.e., using region of via V7, M7, and via V8. In this embodiment, M7 is above M6, and M8 is above M7.

FIG. 3B is a cross sectional view 320 of 1T-1MTJ SHE MRAM bit-cell 300, according to one embodiment of the disclosure. In one embodiment, the source and drain regions of transistor M1 are coupled to metal layers TCN and in turn couple to M0C and M0B lines respectively, where M0C and M0B are segments of metal in M0 layer. In one embodiment, M0C is a continuous line for a row of bit-cells in an array. In one embodiment, source line (SL) is coupled to M0C. In one embodiment, M0B is coupled to M2 layer through via V1, first metal layer (M1), and via V2. In one embodiment, via V2 couples to M2B (segment in M2 layer) and is indirectly coupled to write BL through M2C. In one embodiment, M2B is coupled to M2C through via V2, another segment of M1, and back to M2C through another via V2 coupled to M1, as shown in the dotted region. In one embodiment, MTJ device is located in regions of via V3, M3, and via V4. One end of the MTJ device is coupled to M2B through via V3 while the other end of the MTJ device is coupled to read BL on M4 through via V4. In this embodiment, M2B is the metal with SHE material.

FIG. 3C is a top view 330 of the layout of cross sectional view 320 of 1T-1MTJ SHE MRAM bit-cell 300, according to one embodiment of the disclosure. The MTJ layer is located in back end of the CMOS stack occupying the vertical location of V3-M3-V4.

Figure 3D:
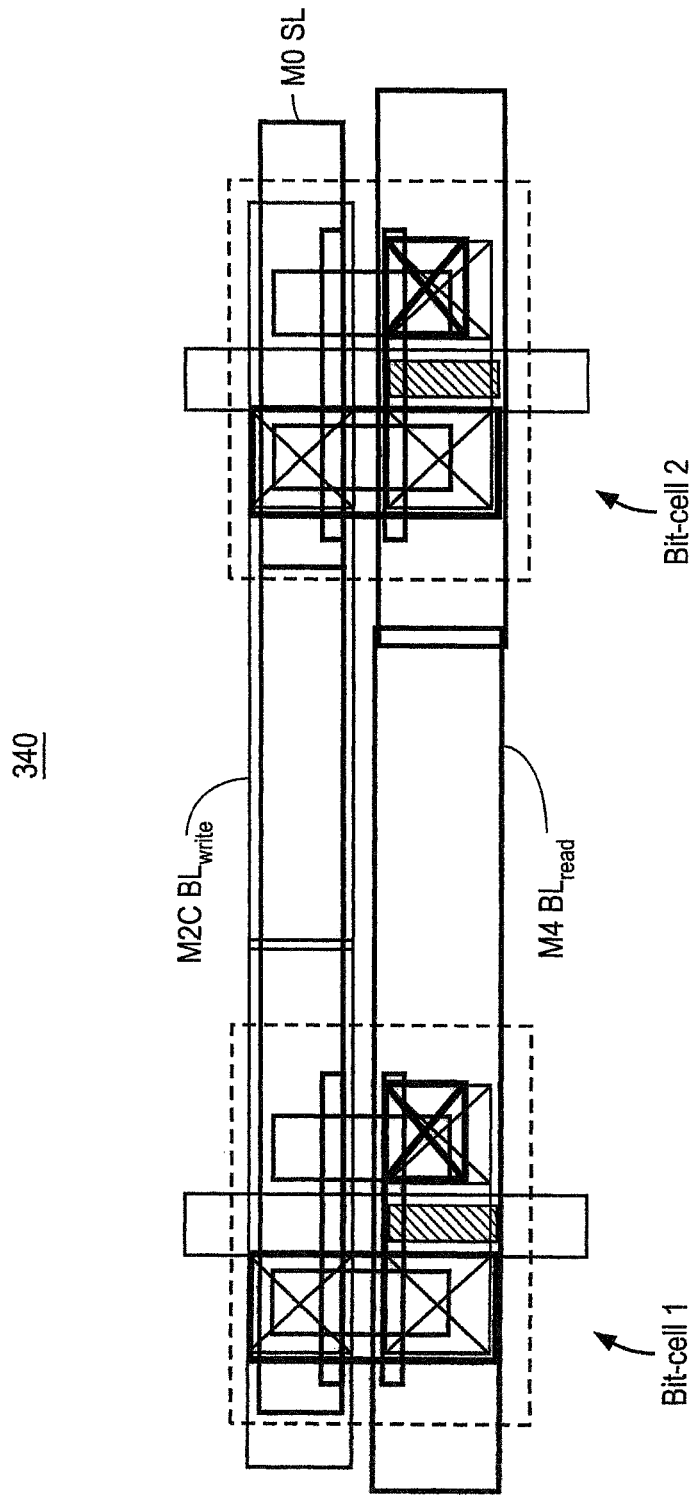
FIG. 3D is a top view of a layout of cross sectional view of two 1T-1MTJ SHE MRAM bit-cells, according to one embodiment of the disclosure.

FIG. 3D is a top view 340 of a layout of cross sectional view 320 of two 1T-1MTJ SHE MRAM bit-cells 300, according to one embodiment of the disclosure. In this embodiment, the interconnectivity shows that M2C (on M2) BL write, M4 BL read, and M0 SL are shared between bit-cells. In this embodiment, the local interconnects with SHE material, which are directly coupled to free magnet layer of the respective MTJ devices of the two bit-cells, are not shared between bit-cells i.e., SHE interconnect is not shared with adjacent cells of a row of bit-cells.

Figure 4A:
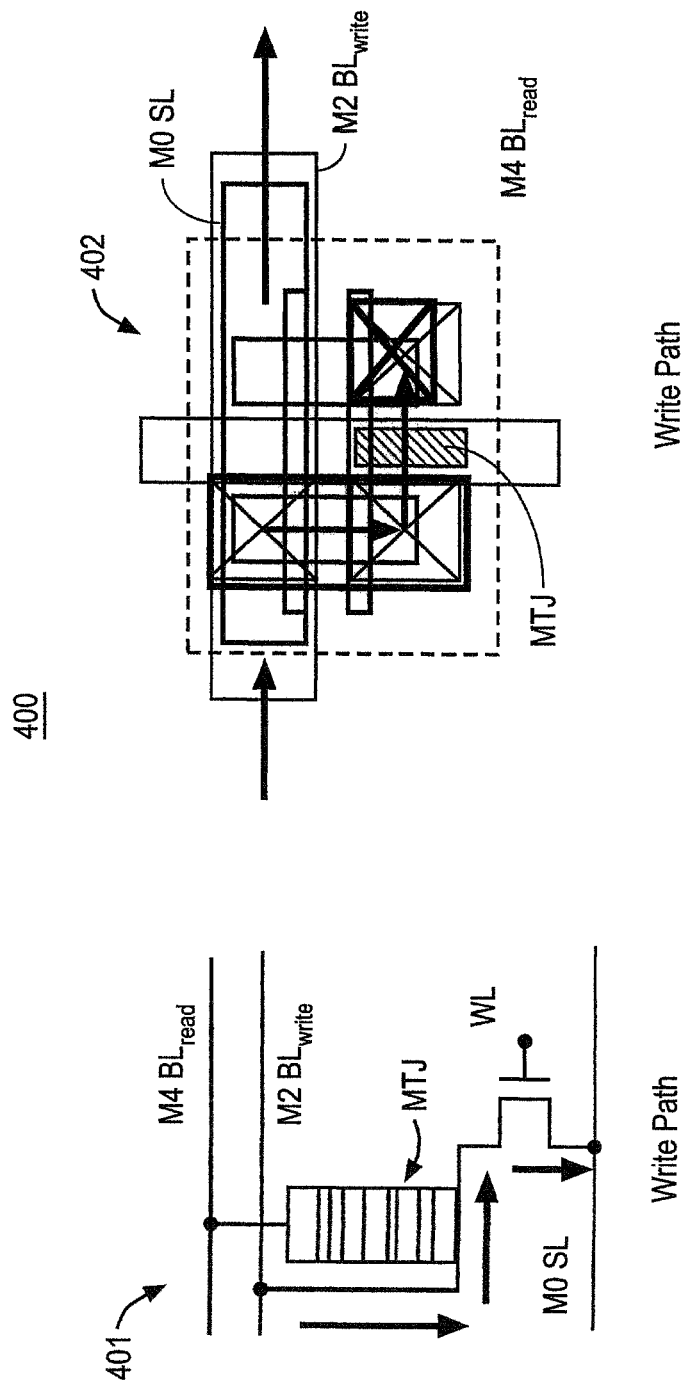
FIGS. 4A-B illustrates differential read and write operation of 1T-1MTJ SHE MRAM, according to one embodiment of the disclosure.
Figure 4B:
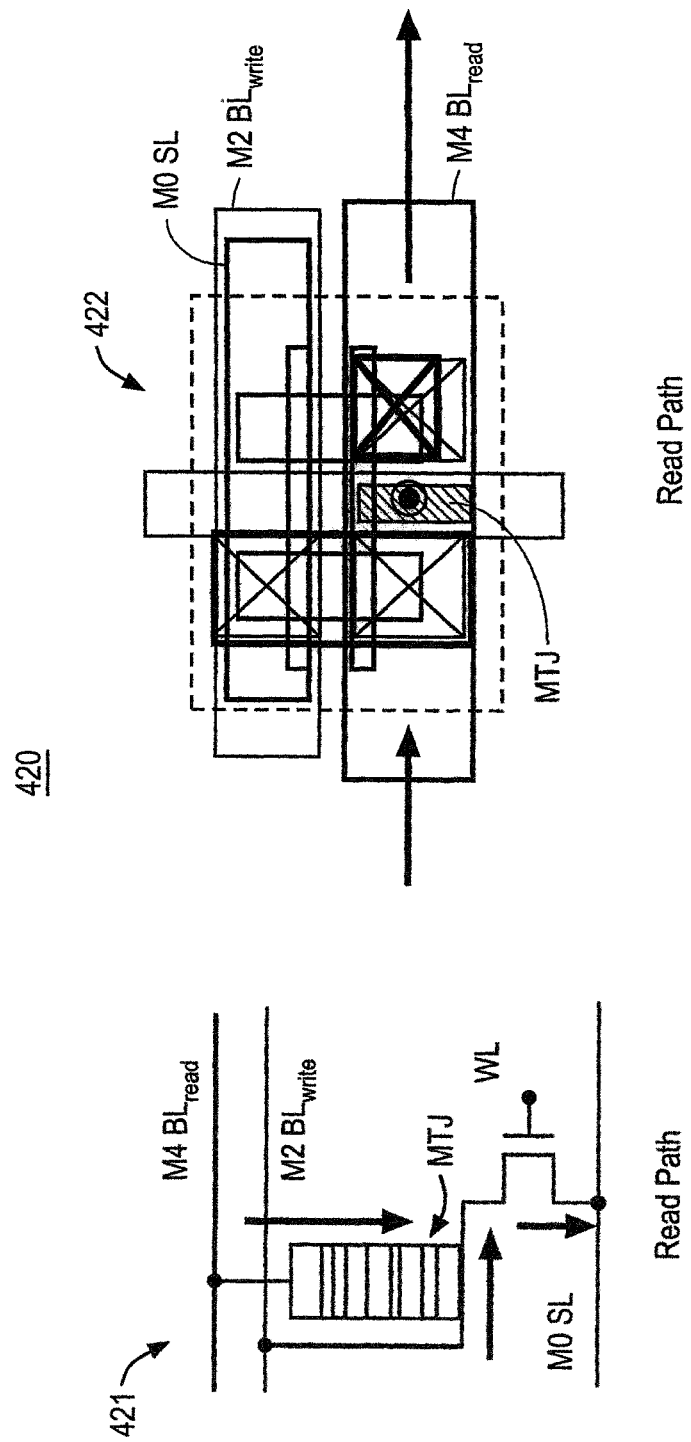

FIGS. 4A-B illustrates differential read and write operation of 1T-1MTJ SHE MRAM, according to one embodiment of the disclosure. It is pointed out that those elements of FIGS. 4A-B having the same reference numbers (or names) as the elements of any other figure can operate or function in any manner similar to that described, but are not limited to such. In one embodiment, bit-cell 300 enables differential (double ended) read and write operations to enable writing 1 and 0, as well as for improved read functionality.

FIG. 4A illustrates write operation 400 of 1T-1MTJ SHE MRAM 401 (which is the same as 300 of FIG. 3A). Layout 402 corresponds to layout 330 of FIG. 3C. Here, only portions of the layout that illustrate the write operation path are shown. In this embodiment, adjacent cells are not disturbed by the write current in the row since the Spin Hall material is only present on the second M2 line for each bit-cell. In one embodiment, the write current is provided by biasing M2 and M0, patterned perpendicular to the word line of bit-cell 300.

FIG. 4B illustrates read operation 420 of 1T-1MTJ SHE MRAM 421 (which is the same as 300 of FIG. 3A). Layout 422 corresponds to layout 330 of FIG. 3C. Here, only portions of the layout that illustrate the write operation path are shown. During read operation, M4 and M0 are coupled to a sense amplifier (not shown). In this embodiment, current flows from M4 (read BL) through MTJ into the transistor M1 to M0 SL. The double circle on MTJ indicates the direction of read current flowing into the drain/source region of transistor M1 and coming out to M0 SL.

FIG. 5A-D are layouts of the 1T-1MTJ SHE MRAM bit-cell, according to another embodiment of the disclosure. It is pointed out that those elements of FIGS. 5A-D having the same reference numbers (or names) as the elements of any other figure can operate or function in any manner similar to that described, but are not limited to such.

Figure 5A:
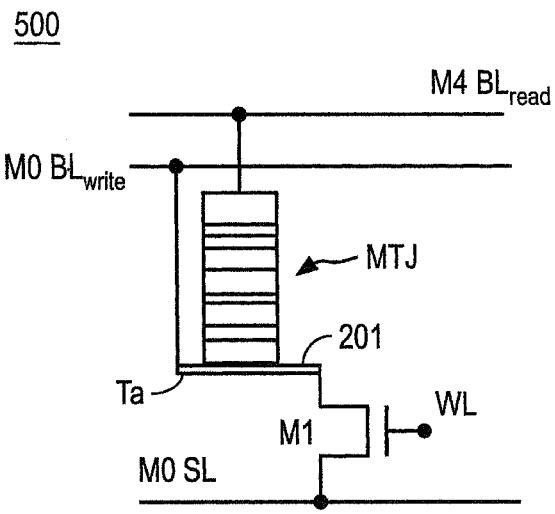

FIG. 5A is an embodiment of 1T-1MTJ SHE MRAM bit-cell 500 in which SL is formed with M0, write BL is formed with M0, read BL is formed with M4, and the MTJ device is formed in the region dedicated for M3. In this embodiment, bit-cell 500 comprises of a select transistor M1 with gate controlled by a word line WL. In one embodiment, the write terminal of the bit-cell is coupled via a bottom electrode patterned to make contact with the free magnetic layer of the MTJ. In this embodiment, MTJ device is located in layers V2-M2-V3.

Figure 5B:
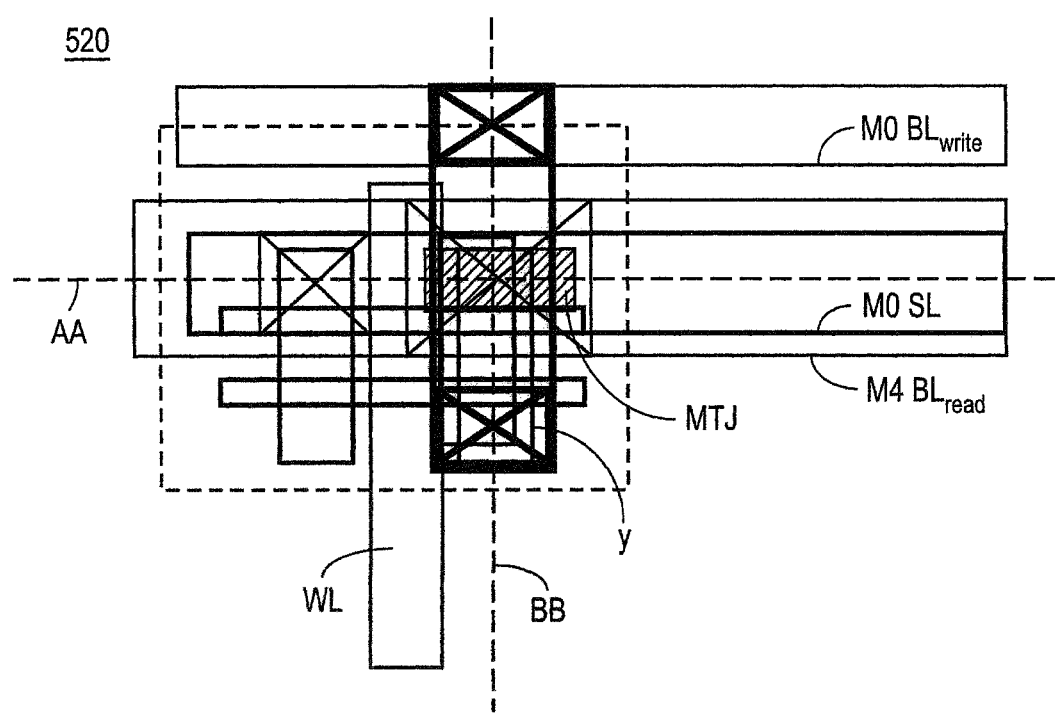

FIG. 5B is a layout 520 of 1T-1MTJ SHE MRAM bit-cell 500. The dashed lines AA and BB are shown in FIGS. 5C and 5D respectively. In this embodiment, MTJ device is located in layers V2-M2-V3. The area of bit-cell 520 is enlarged by 30% over the area of bit-cell 330 due to the change in location of the MTJ stack. However, differential write and read operations are maintained. In one embodiment, to reduce the impact of the area increase, M0-BL write is shared between two adjacent columns.

FIG. 5C shows a cross-section 530 of section AA which is parallel to the length of the magnet, according to one embodiment. In this embodiment, SL is formed on M0-C layer (i.e., on M0). In this embodiment, the SHE material is located on M1 region and is directly coupled to the free magnet layer of the MTJ device. Read BL is on M4 and is coupled to the MTJ device through via V4, segment of M3, and via V3. The landing pad 'y' couples one of the source/drain terminals of transistor M1 to SHE material based M1 layer. FIG. 5D shows a cross-section 540 of section BB which is perpendicular to the length of the magnet, according to one embodiment. In this embodiment, write BL, read BL, and select line are parallel and flowing in the same direction to enable differential write of MTJ.

Figure 6:
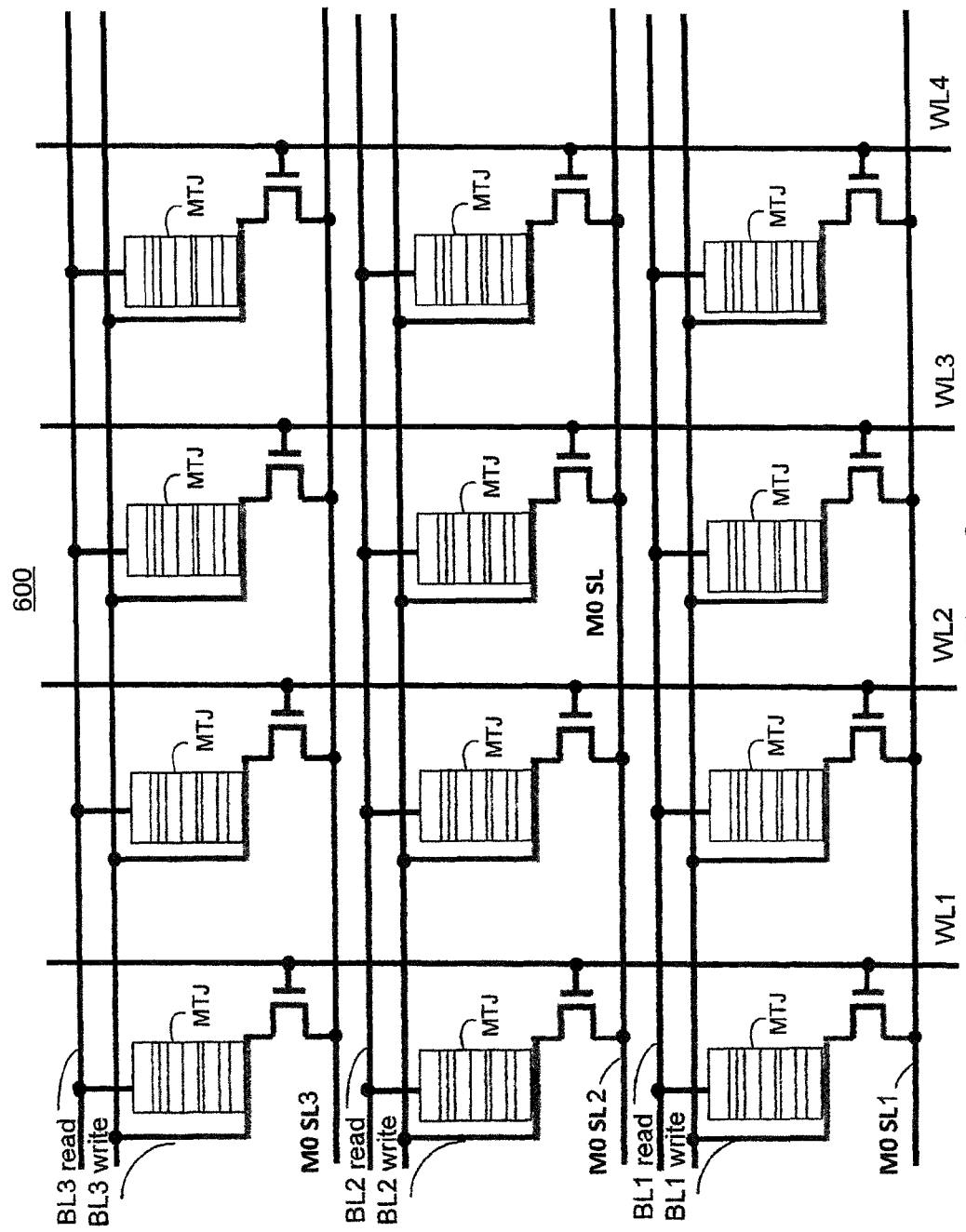
FIG. 6 is an array of 1T-1MTJ SHE MRAM bit-cells, according to one embodiment of the disclosure.

FIG. 6 is an array 600 of 1T-1MTJ SHE MRAM bit-cells, according to one embodiment of the disclosure. It is pointed out that those elements of FIG. 6 having the same reference numbers (or names) as the elements of any other figure can operate or function in any manner similar to that described, but are not limited to such. So as not to obscure the embodiments, a 3×4 array of MRAM is shown with three horizontal rows and four vertical columns. However, the embodiments are applicable to any array size.

In this embodiment, array 600 comprises a plurality of MTJ bit-cells i.e., a plurality select lines (SLs) on M0 i.e., M0 SL1-3, a plurality of write bit lines—BL1-3 write; a plurality of read bit lines—BL1-3 read, a plurality of interconnects with SHE material coupled to corresponding free magnet layer of a plurality of MTJ devices such that SHE interconnects are not shared between MTJ devices; and a plurality of rows of transistors, where transistors in each row are coupled to one of a select line of the plurality of select lines, and where each interconnect of the plurality of interconnects in a row of transistors is coupled to one of the write bit lines. In one embodiment, each of the plurality of read bit lines is coupled to a row of MTJ devices from among the plurality of rows of MTJ devices. The bit-cell may be implemented according to any of the embodiments of this disclosure.

Figure 7:
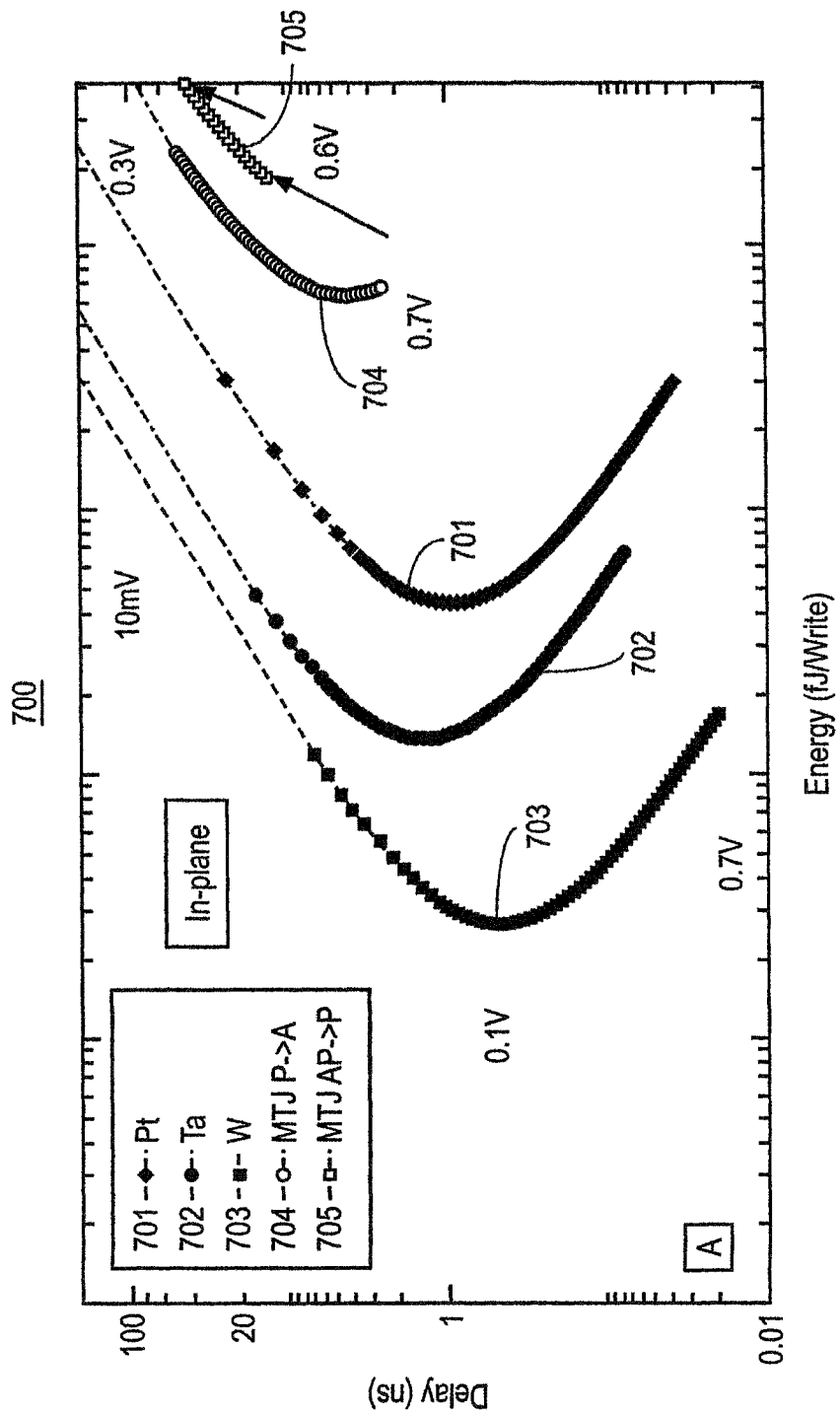
FIG. 7 is a plot of write energy-delay conditions for 1T-1MTJ SHE MRAM bit-cell compared to traditional MTJs, according to one embodiment.

FIG. 7 is a plot 700 of write energy-delay conditions for 1T-1MTJ SHE MRAM bit-cell compared to traditional MTJs, according to one embodiment. The x-axis is energy (fJ/Write) and y-axis is delay in nano-seconds. Plot 700 shows five waveforms. Plot 700 compares the energy-delay trajectory of GSHE and MTJ (GSHE-MTJ) devices for in-plane magnet switching as the applied write voltage is varied. The energy-delay trajectory (for in-plane switching) can be written as:

$$E(\tau) = R_{write} I_{co}^2 \frac{\left(\tau + \tau_0 \ln\left(\frac{\pi}{2\theta_0}\right)\right)^2}{\tau} = \frac{4}{h^2} \frac{R_{write}}{P^2} \frac{1}{\tau} \left(\mu_0 e \alpha M_s V \frac{M_s}{2} \left(\tau + \tau_0 \ln\left(\frac{\pi}{2\theta_0}\right)\right)\right)^2 \quad (3)$$

where $R_{write}$ is the write resistance of the devices (RGSHE or RMTJ-P, RMTJ-AP), 'P' is the spin current polarization (PGSHE or PMTJ), $\mu_0$ is vacuum permeability, and 'e' is the electron charge. The energy at a given delay is directly proportional to the square of the Gilbert damping. $\tau_0 = M_s Ve/I_c P \mu_B$ varies as the spin polarization varies for various GSHE metal electrodes. The combined effect of spin Hall polarization, damping and resistivity of the spin Hall electrodes is plotted in plot 700.

All the cases considered in plot 700 assume a 30×60 nm magnet with 40 kT thermal energy barrier and 3.5 nm GSHE electrode thicknesses. The energy-delay trajectories of the devices are obtained assuming a voltage sweep from 0-0.7 V in accordance to voltage restrictions of scaled CMOS. The energy-delay trajectory of the GSHE-MTJ devices exhibits broadly two operating regions. Region 1 where the energy delay product is approximately constant, which is expressed as:

$$(\tau_d < M_s Ve/I_c P \mu_B) \quad (4)$$

Region 2 where the energy is proportional to the delay, which is expressed as:

$$\tau_d > M_s Ve/I_c P \mu_B \quad (5)$$

The two regions are separated by energy minima at:

$$\tau_{opt} = M_s Ve/I_c P \mu_B \quad (6)$$

where minimum switching energy is obtained for the spin torque devices.

The energy-delay trajectory of the STT-MTJ devices (plots 704 and 705) is limited with a minimum delay of 1ns for in-plane devices at 0.7 V maximum applied voltage, the switching energy for P-AP and AP-P are in the range of 1 pJ/write. In contrast, the energy-delay trajectory of GSHE-MTJ (in-plane anisotropy) devices 701, 702, and 703 can enable switching times as low as 20 ps (β-W with 0.7 V, 20 fJ/bit) or switching energy as small as 2 fJ (β-W with 0.1 V, 1.5 ns switching time). Plot 700 shows that 1T-1 SHE MTJ device with same energy exhibits lower write operation delay.

Figure 8:
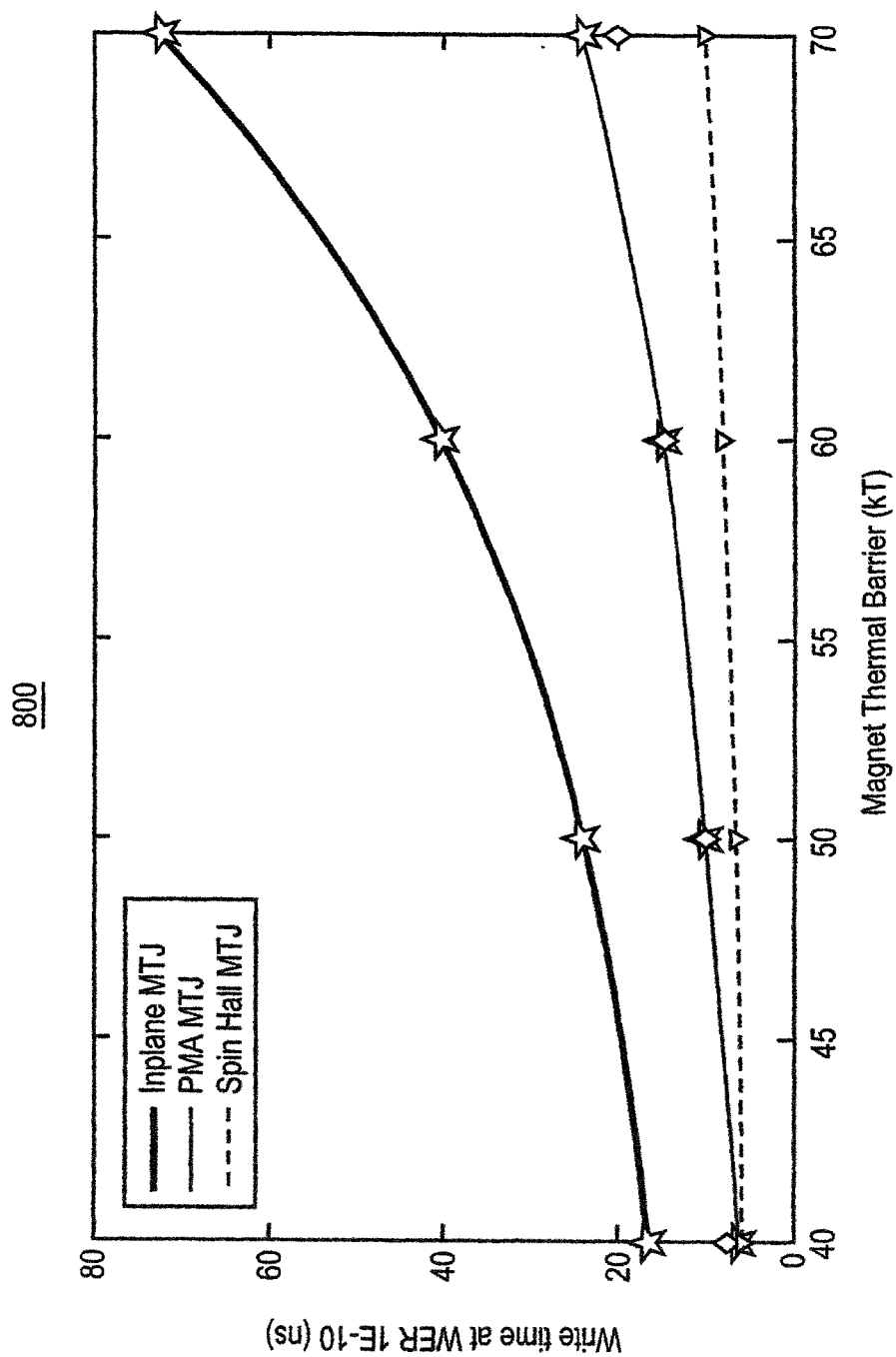
FIG. 8 is a plot of reliable write times for 1T-1MTJ SHE MRAM bit-cell and traditional MTJs, according to one embodiment.

FIG. 8 is a plot 800 of reliable write times for 1T-1MTJ SHE MRAM bit-cell and traditional MTJs, according to one embodiment. Plot 800 shows write times of the 1T-1 SHE MTJ devices using bit-cell circuit simulations coupled with Landau-Lifshitz-Gilbert nanomagnet dynamics. The Spin Hall MTJ shows significant write time improvement compared to perpendicular and in-plane MTJs.

Figure 9:
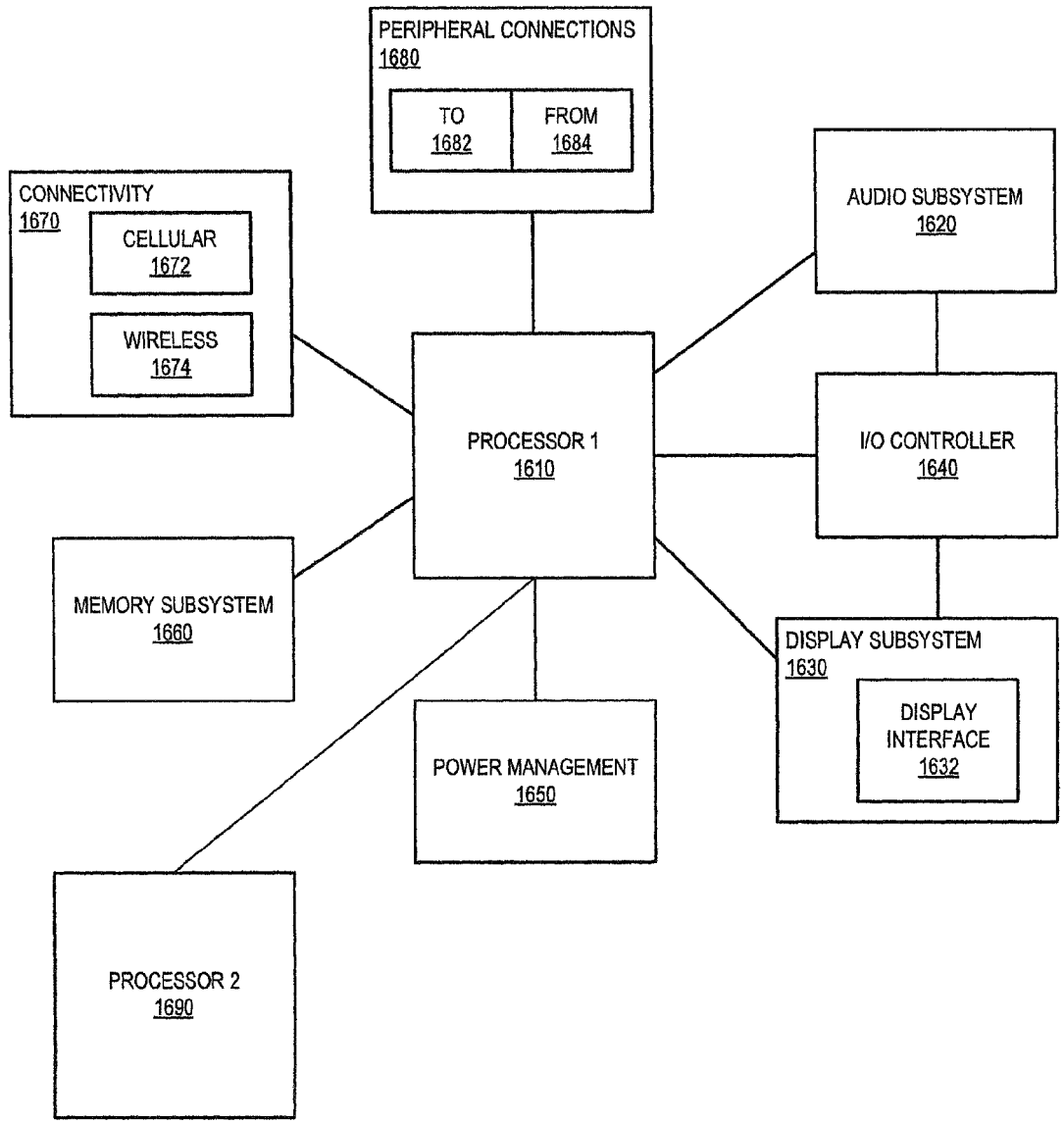
FIG. 9 is a smart device or a computer system or an SoC (system-on-chip) with 1T-1MTJ SHE MRAM bit-cell, according to one embodiment of the disclosure.

FIG. 9 is a smart device or a computer system or an SoC (system-on-chip) with 1T-1MTJ SHE MRAM bit-cell, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with MTJ SHE MRAM bit-cell, according to the embodiments discussed. Other blocks of the computing device 1600 may also include the MTJ SHE MRAM bit-cell of the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a select line; an interconnect with SHE material, the interconnect coupled to a write bit line; a transistor coupled to the select line and the interconnect, the transistor controllable by a word line; and an MTJ device having a free magnetic layer coupled to the interconnect. In one embodiment, one end of the MTJ device is coupled to a read bit line. In one embodiment, the select line is formed on a zero metal (M0) layer. In one embodiment, the read bit line is formed on a fourth metal (M4) layer, and wherein the write bit line is formed on a second metal (M2) layer.

In one embodiment, the MTJ device is operable to increase its resistance during read operation, and wherein the MTJ device is operable to decrease its resistance during write operation. In one embodiment, the interconnect is exclusive to a single MTJ device. In one embodiment, the transistor is a single transistor and the MTJ device is a single MTJ device. In one embodiment, the single transistor is formed from multiple diffusions or shared diffusion such that a channel region of the transistor behaves as two or more transistors in parallel. In one embodiment, the MTJ device is physically located between the read bit line and the write bit line, and wherein the read bit line, the write bit line, and the select line are parallel to one another and flowing in the same direction.

In another example, a method comprises: forming a transistor having source region, drain region, and gate region; forming a select line in metal zero (M0); coupling the select line to the source region of the transistor; forming an interconnect with SHE material; coupling the interconnect to a first metal (M1) layer and to the drain terminal of the transistor; and coupling a word line to the gate region of the transistor.

In one embodiment, the method further comprises: forming a write bit line in a second metal (M2) layer; and coupling the write bit line to the interconnect, wherein the MTJ device is physically located between the read bit line and the write bit line, and wherein the read bit line, the write bit line, and the select line are parallel to one another and flowing in the same direction. In one embodiment, the method further comprises: forming an MTJ device in a region dedicated for a third metal (M3) layer; and coupling a free magnetic layer of the MTJ device to the interconnect.

In one embodiment, the method further comprises: forming a read bit line in a fourth metal (M4) layer; and coupling the read bit line to the MTJ device, wherein the MTJ device is physically located between the read bit line and the write bit line, and wherein the read bit line, the write bit line, and the select line are parallel to one another and flowing in the same direction. In one embodiment, the method further comprises: forming an MTJ device in a region dedicated for a second metal (M2) layer; and coupling a free magnetic layer of the MTJ device to the interconnect. In one embodiment, the method further comprises: forming a read bit line in a fourth metal (M4) layer; and coupling the read bit line to the MTJ device via a third metal (M3) layer. In one embodiment, the interconnect is exclusive to a single MTJ device.

In another example, in one embodiment, an apparatus comprises: a plurality of select lines; a plurality of write bit lines; a plurality of interconnects with SHE material; and a plurality of rows of transistors, wherein transistors in each row are coupled to one of a select line of the plurality of select lines, wherein each interconnect of the plurality of interconnects in a row of transistors is coupled to one of the write bit lines. In one embodiment, apparatus further comprises: a plurality of read bit lines; and a plurality of rows of MTJ devices each having a free magnetic layer coupled to one of the interconnects, wherein each interconnect is indirectly coupled to each other. In one embodiment, each of the plurality of read bit lines is coupled to a row of MTJ devices from among the plurality of rows of MTJ devices. In one embodiment, each of the MTJ devices is operable to increase its resistance during read operation, and wherein each of the MTJ devices is operable to decrease its resistance during write operation.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a select line;
an interconnect with Spin Hall Effect (SHE) material, the interconnect coupled to a write bit line;
a transistor coupled to the select line and the interconnect, the transistor controllable by a word line; and
a Magnetic Tunnel Junction (MTJ) device having a free magnetic layer coupled to the interconnect, the MTJ device comprising free and fixed magnetic layers and a tunneling material between the free and fixed magnetic layers.

2. The apparatus of claim 1, wherein one end of the MTJ device is coupled to a read bit line.

3. The apparatus of claim 2, wherein the MTJ device is physically located between the read bit line and the write bit line, and wherein the read bit line, the write bit line, and the select line are parallel to one another and flowing in the same direction.

4. The apparatus of claim 1, wherein the select line is formed on a zero metal (M0) layer.

5. The apparatus of claim 1, wherein the read bit line is formed on a fourth metal (M4) layer, and wherein the write bit line is formed on a second metal (M2) layer.

6. The apparatus of claim 1, wherein the MTJ device is operable to increase its resistance during read operation, and wherein the MTJ device is operable to decrease its resistance during write operation.

7. The apparatus of claim 1, wherein the interconnect is exclusive to a single MTJ device.

8. The apparatus of claim 1, wherein the transistor is a single transistor and the MTJ device is a single MTJ device.

9. The apparatus of claim 8, wherein the single transistor is formed from multiple diffusions or shared diffusion such that a channel region of the transistor behaves as two or more transistors in parallel.

10. A method comprising:
forming a transistor having source region, drain region, and gate region;
forming a select line in metal zero (M0);
coupling the select line to the source region of the transistor;
forming an interconnect with Spin Hall Effect (SHE) material;
coupling the interconnect to a first metal (M1) layer and to the drain terminal of the transistor; and
coupling a word line to the gate region of the transistor;
forming an MTJ device comprising free and fixed magnetic layers and a tunneling material between the free and fixed magnetic layers, the MTJ device being coupled to the interconnect.

11. The method claim 10 further comprising:
forming a write bit line in a second metal (M2) layer; and
coupling the write bit line to the interconnect, wherein the MTJ device is physically located between the read bit line and the write bit line, and wherein the read bit line, the write bit line, and the select line are parallel to one another and flowing in the same direction.

12. The method of claim 11 further comprising:
forming the Magnetic Tunnel Junction (MTJ) device in a region dedicated for a third metal (M3) layer; and
coupling the free magnetic layer of the MTJ device to the interconnect.

13. The method of claim 12 further comprising:
forming a read bit line in a fourth metal (M4) layer; and
coupling the read bit line to the MTJ device, wherein the MTJ device is physically located between the read bit line and the write bit line, and wherein the read bit line, the write bit line, and the select line are parallel to one another and flowing in the same direction.

14. The method of claim 10 further comprising:
forming the Magnetic Tunnel Junction (MTJ) device in a region dedicated for a second metal (M2) layer; and
coupling the free magnetic layer of the MTJ device to the interconnect.

15. The method of claim 14 further comprising:
forming a read bit line in a fourth metal (M4) layer; and
coupling the read bit line to the MTJ device via a third metal (M3) layer.

16. The method of claim 10, wherein the interconnect is exclusive to a single MTJ device.

17. An apparatus comprising:
a plurality of select lines;
a plurality of write bit lines;
a plurality of interconnects with Spin Hall Effect (SHE) material; and
a plurality of rows of transistors, wherein transistors in each row are coupled to one of a select line of the plurality of select lines, wherein each interconnect of the plurality of interconnects in a row of transistors is coupled to one of the write bit lines; and,
a plurality of MTJ devices respectively coupled to the plurality of interconnects, each of the MTJ devices comprising free and fixed magnetic layers and a tunneling material between the free and fixed magnetic layers.

18. The apparatus of claim 17 further comprises:
a plurality of read bit lines; and
a plurality of rows of the Magnetic Tunnel Junction (MTJ) devices each having its free magnetic layer coupled to one of the interconnects, wherein each interconnect is indirectly coupled to each other.

19. The apparatus of claim 18, wherein each of the plurality of read bit lines is coupled to a row of the MTJ devices from among the plurality of rows of MTJ devices.

20. The apparatus of claim 18, wherein each of the MTJ devices is operable to increase its resistance during read operation, and wherein each of the MTJ devices is operable to decrease its resistance during write operation.

* * * * *